(12) United States Patent
Tani

(10) Patent No.: US 7,491,923 B2
(45) Date of Patent: Feb. 17, 2009

(54) SOLID STATE IMAGING DEVICE INCLUDING A CONVERGING STRUCTURE

(75) Inventor: Takeharu Tani, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 65 days.

(21) Appl. No.: 11/644,943

(22) Filed: Dec. 26, 2006

(65) Prior Publication Data
US 2007/0145241 A1    Jun. 28, 2007

(30) Foreign Application Priority Data
Dec. 27, 2005    (JP)    ............................. 2005-374888

(51) Int. Cl.
*H01L 27/00*    (2006.01)
(52) U.S. Cl. ................. 250/208.1; 250/216; 257/432; 438/65
(58) Field of Classification Search ............. 250/208.1, 250/226; 257/294, 432, 291, 292; 438/65; 348/241, 243, 245, 307–310
See application file for complete search history.

(56) References Cited

U.S. PATENT DOCUMENTS

| 5,691,548 | A | * | 11/1997 | Akio | ........................ | 257/232 |
| 6,734,031 | B2 | * | 5/2004 | Shizukuishi | ................. | 438/22 |
| 6,833,601 | B2 | * | 12/2004 | Murakami | .................. | 257/437 |
| 7,084,472 | B2 | * | 8/2006 | Fukuyoshi et al. | .......... | 257/432 |
| 2005/0045805 | A1 | * | 3/2005 | Sakoh et al. | ............. | 250/208.1 |

FOREIGN PATENT DOCUMENTS

JP    2000-150845 A    5/2000
JP    2001-44406 A    2/2001

\* cited by examiner

*Primary Examiner*—Georgia Y Epps
*Assistant Examiner*—Tony Ko
(74) *Attorney, Agent, or Firm*—Birch, Stewart, Kolasch & Birch, LLP

(57) ABSTRACT

A solid state imaging device has a semiconductor substrate with photodiodes and charge transfer sections formed thereon, transfer electrodes formed on the charge transfer sections across an insulating layer, and a light shielding layer to protect the charge transfer sections from light. The light shielding layer has openings to correspond the positions of the photodiodes. Disposed above the openings of the light shielding layer are microlenses, and a converging structure such as a converging lens is provided inside each opening. Incident light rays from the microlens are focused toward the photodiode effectively by the converging lens.

9 Claims, 7 Drawing Sheets

SOLID STATE IMAGING DEVICE INCLUDING A CONVERGING STRUCTURE

FIELD OF THE INVENTION

The present invention relates to a solid state imaging device with excellent focusing efficiency.

BACKGROUND OF THE INVENTION

Recently, digital cameras are widely used which convert images, captured by a solid state imaging device such as CCD, into digital image data and store the data in recording media, such as an internal memory and a memory card. In order to facilitate focusing light rays on light receiving elements, such as photodiodes arranged in a matrix, the solid state imaging device in such digital cameras is generally equipped with microlenses located above the light receiving elements.

FIG. 7 illustrates a structure in cross section of a conventional CCD. In FIG. 7, a CCD 100 includes a semiconductor substrate 102 with photodiodes 101 formed therein, a transparent insulating film 103 on a top surface of the semiconductor substrate 102, transfer electrodes 104 next to each line of the photodiodes 101, a light shielding layer 105 to cover the transfer electrodes 104 for light protection and having openings 106 above each photodiode 101, a planarizing layer 107 with a flat top surface for covering over the light shielding layer 105 and the photodiodes 101, a color filter 108 on the planarizing layer 107, and a microlens array 109 above the color filter 108 aligned such that microlenses 109a are located above each photodiode 101. In the CCD 100, a light ray is converged by the microlens 109a and received by the photodiode 101, which generates an electric charge proportional to the amount of light received. The generated electric charge is then transferred as a signal charge in a vertical direction by the transfer electrodes 104. The microlens array 109 is a transparent material layer on the color filter 108 and has microlenses 109a shaped by, for example, a dry etching technique.

Unfortunately, the present-day dry etching techniques hardly put all the microlenses 109a into exactly the same shape. As a result, an efficiency for focusing light ray (i.e., focusing efficiency) varies among the microlenses 109. Additionally, the solid state imaging devices are becoming even smaller yet hold more pixels in these days, and the photodiodes are getting smaller in dimension. There is therefore a need to focus incident light rays effectively on the photodiodes. Accordingly, Japanese Patent Laid-open Publication No. 2001-44406 discloses a solid state imaging device which has a condensing lens directly above a light receiving part. Furthermore, Japanese Patent Laid-open Publication No. 2000-150845 discloses a solid state imaging device which has a well-form trench structure that directs a light ray from a color filter to a light receiving part. These components serve to prevent deterioration of the focusing efficiency due to variation in shape of the microlenses.

However, even these solid state imaging devices cannot provide sufficient focusing efficiency and sometimes cause smear noise that appears as a vertical whitish line on a captured image. Rightly, an incident light ray from the microlens 109a should be directed to the opening 106 of the light shielding layer 105 and reach the photodiode 101. Insufficient focusing, however, allows some of the incident light rays to go toward the light shielding layer 105. Hardly does the light shielding layer 105 provide an absolute light shielding function, such an incident light ray, if it is intense enough, can permeate the transfer electrode 104 and reach a charge transfer section 110 where the incident light ray is converted into an electric charge. This electric charge saturates the signal charge in the charge transfer section 110 and causes the smear noise.

Another disadvantage of the Japanese Patent Laid-open Publication No. 2001-44406 is that the condensing lens above the light receiving part has a lower refractive index than the surrounding planarizing layer. This configuration makes the light rays proceeding form a flattening, or planarizing, layer toward the condensing lens more likely to diffuse and may possibly deteriorate the focusing efficiency. Another disadvantage of the Japanese Patent Laid-open Publication No. 2000-150845 is the formation of the well-form trench structure that extends from the microlens toward the light receiving part. Such a trench structure is very difficult to form in modern solid state imaging devices that are so small in dimension. As a result, voids and other defects are more likely to occur, and effective focusing of light rays on the light receiving part is hardly achieved.

SUMMARY OF THE INVENTION

In view of the foregoing, a primary object of the present invention is to provide a solid state imaging device to improve an efficiency for focusing light rays toward light receiving elements in a semiconductor substrate.

Another object of the present invention is to provide a solid state imaging device to prevent light rays from heading to transfer electrodes and avoid an occurrence of smear noise.

In order to achieve the above and other objects, the solid state imaging device according to the present invention includes a semiconductor substrate, a light shielding layer, a planarizing layer, microlenses, and a converging structure. Formed in the semiconductor substrate are light receiving elements and vertical transfer paths for transferring electric charges accumulating in the light receiving elements. Provided on the semiconductor substrate is the light shielding layer, which covers the vertical transfer paths for protection from light and has openings formed at positions corresponding to the light receiving elements. The light shielding layer and the light receiving elements are covered by the plarnarizing layer, above which the microlenses are disposed to focus light toward the light receiving elements. The converging structure is provided inside each opening and has a higher refractive index than the surrounding medium such as, for example, the plarnarizing layer.

It is preferable that the converging structure satisfies an equation of $D=(\lambda/n_2)\{1/4+N/2\}$, where D is a thickness of a centre portion of the converging structure, $\lambda$ is a wavelength of light entering the converging structure, and N is an integer. The converging structure is either a plano-convex lens, a rectangular solid block, or a plano-concave lens. More preferably, the refractive index of the converging structure is gradually decreasing from the center toward the edge. When the converging structure is the rectangular solid block or the plano-concave lens, the converging structure preferably have an outer circumference smaller than the opening. It is more preferable in this case to provide an anti-reflection film between each converging structure and photodiode. Favorably, the anti-reflection film satisfies the equations of $D=(\lambda/n_2)\{1/4+N/2\}$, where D is a thickness of a centre portion of the anti-reflection film, $\lambda$ is a wavelength of light entering the anti-reflection film, and N is an integer.

According to the solid state imaging device of the present invention, the covering structure that has a higher refractive index than the surrounding medium is provided inside each of the openings for the photodiodes. This configuration improves the efficiency for focusing light toward the light receiving elements. It is therefore possible to prevent light from permeating transfer electrodes, and smear noise is prevented.

Since the converging structure is appropriately adjusted in shape, refractive index, and center portion's thickness, the focusing efficiency is more improved. In accordance with the embodiment using the anti-reflection film between the converging structure and the photodiode, reflection of the incident light is prevented effectively and the focusing efficiency is even more improved.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENTS

Figure 1:
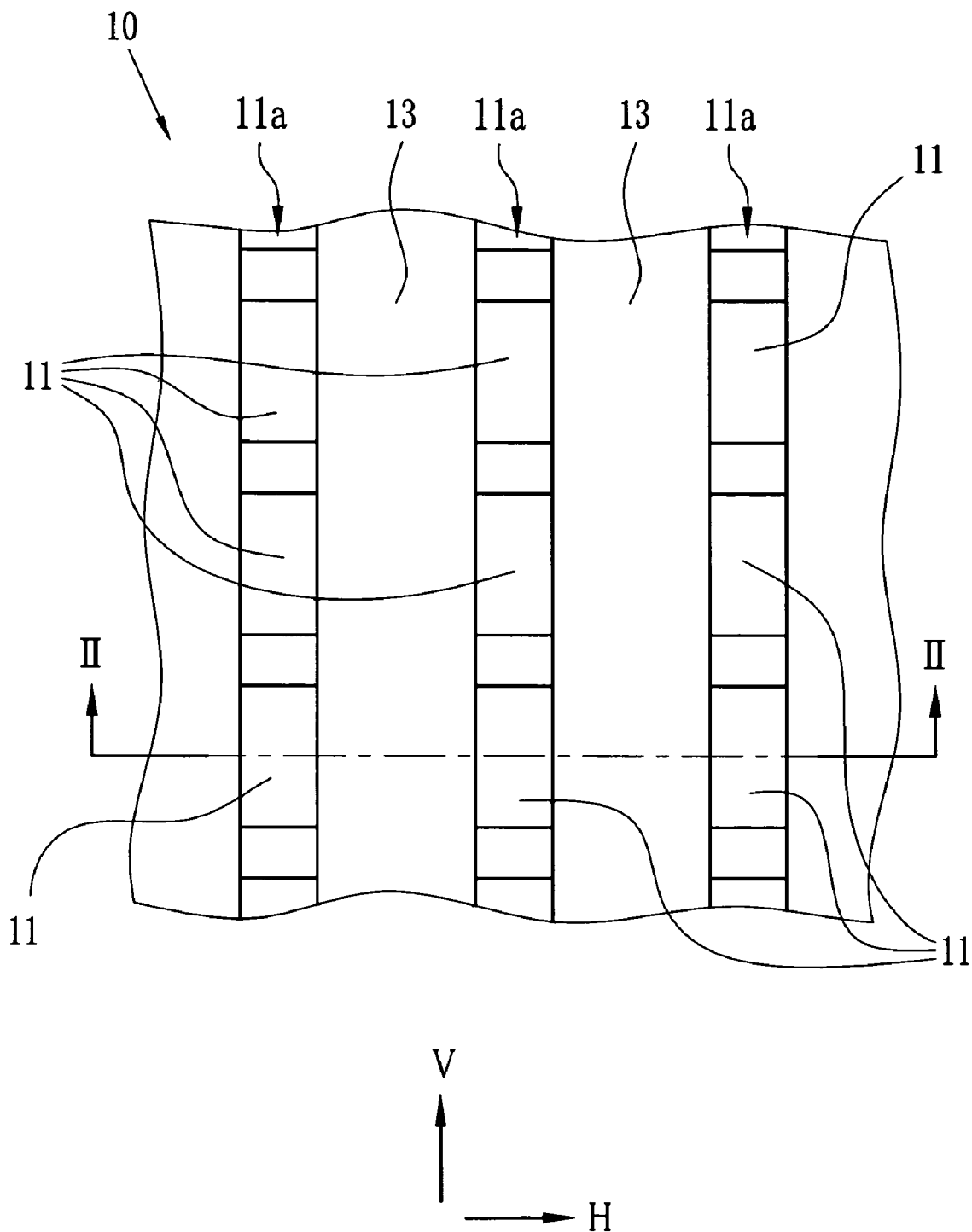
FIG. 1 is an explanatory view of a solid state imaging device according to a first embodiment of the present invention.

Referring to FIG. 1, a solid state imaging device such as, for example, a CCD 10 has a plurality of photodiode arrays 11a that extend in a vertical transfer direction V. Each photodiode array 11a includes a plurality of photodiodes (light receiving elements) 11 arranged at regular intervals. Formed next to the photodiode arrays 11a are vertical transfer paths 13 that also extend in the vertical transfer direction V. It is to be noted that an upper structure, such as a light shielding layer, is not illustrated in FIG. 1.

Figure 2:
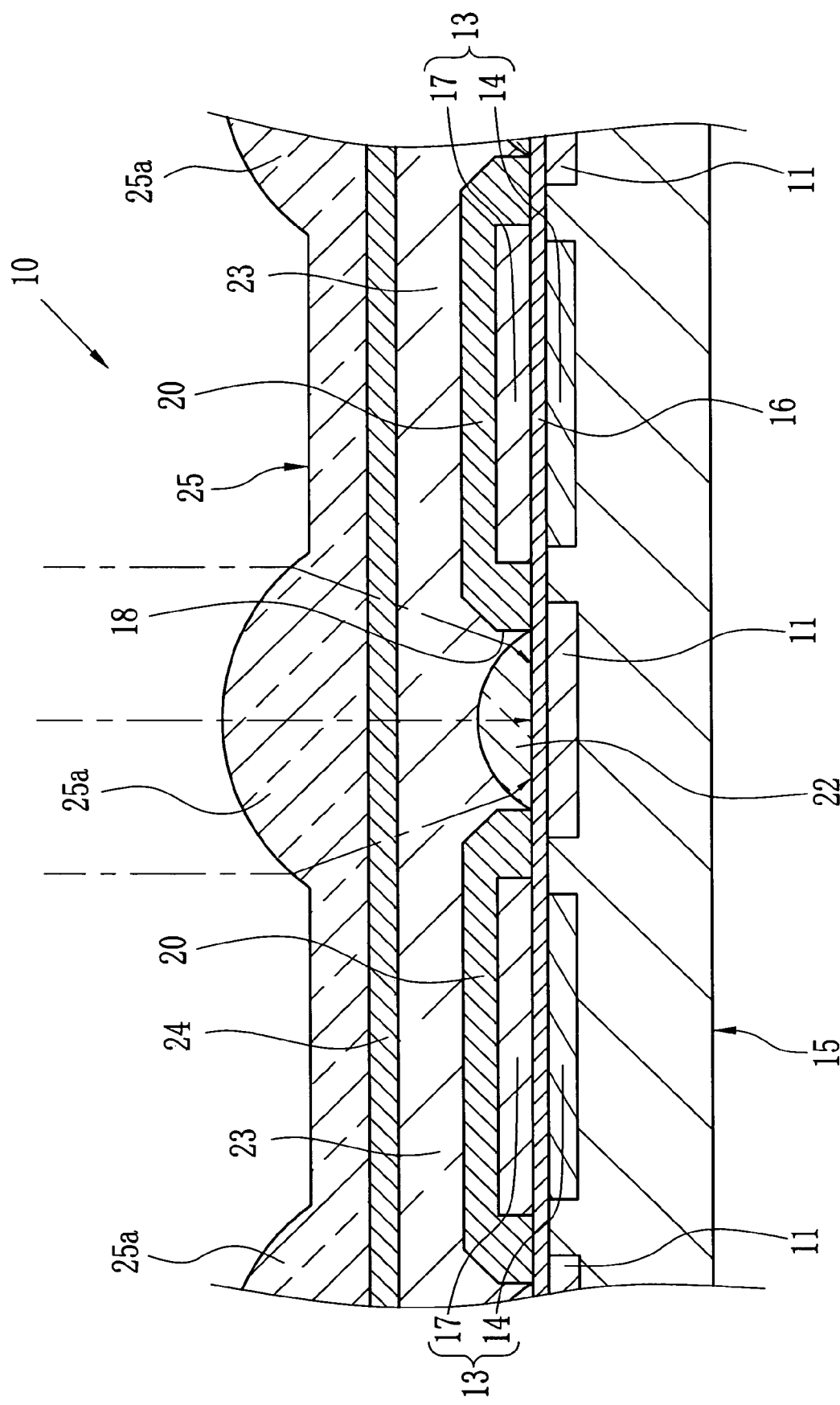
FIG. 2 is a cross sectional view along a line II-II of FIG. 1.

As shown in FIG. 2, the CCD 10 has a semiconductor substrate 15 on which the photodiode arrays 11a and charge transfer sections 14 are formed one after the other in a horizontal transfer direction H (see, FIG. 1). Above the charge transfer sections 14 across an insulating layer 16, transfer electrodes 17 are formed. The charge transfer section 14 and the transfer electrode 17 constitute the vertical transfer path 13 shown in FIG. 1, and vertically transfer electric charges accumulated in the photodiodes 11. The transfer electrodes 17 are made from, for example, polysilicon by a dry etching method. The insulating layer 16 is made from, for example, $SiO_2$ by a thermal oxidation method or a CVD (Chemical Vapor Deposition) method.

The transfer electrodes 17 and the insulating layer 16 are covered by a light shielding layer 20 which is made of a metal, such as aluminum, by a sputtering method or the like. The light shielding layer 20 has openings 18 above each photodiode 11. Provided inside each opening 18 is a converging lens (i.e., converging structure) 22. The converging lenses 22 and the light shielding layer 20 are covered by a transparent planarizing layer 23 that has a flat top surface, on which a color filter 24 is placed. Above the color filter 24, a microlens array 25 with microlenses 25a is provided. The planarizing layer 23 is made of, for example, BPSG (Boron Phosphorous Silicon Glass). The color filter 24 is a film with mosaic patterns of three primary colors and made of a resist material containing the pigments of three primary colors. Alternatively, the color filter 24 may have a neutral color in addition to the three primary colors (i.e., four colors in total).

Figure 3:
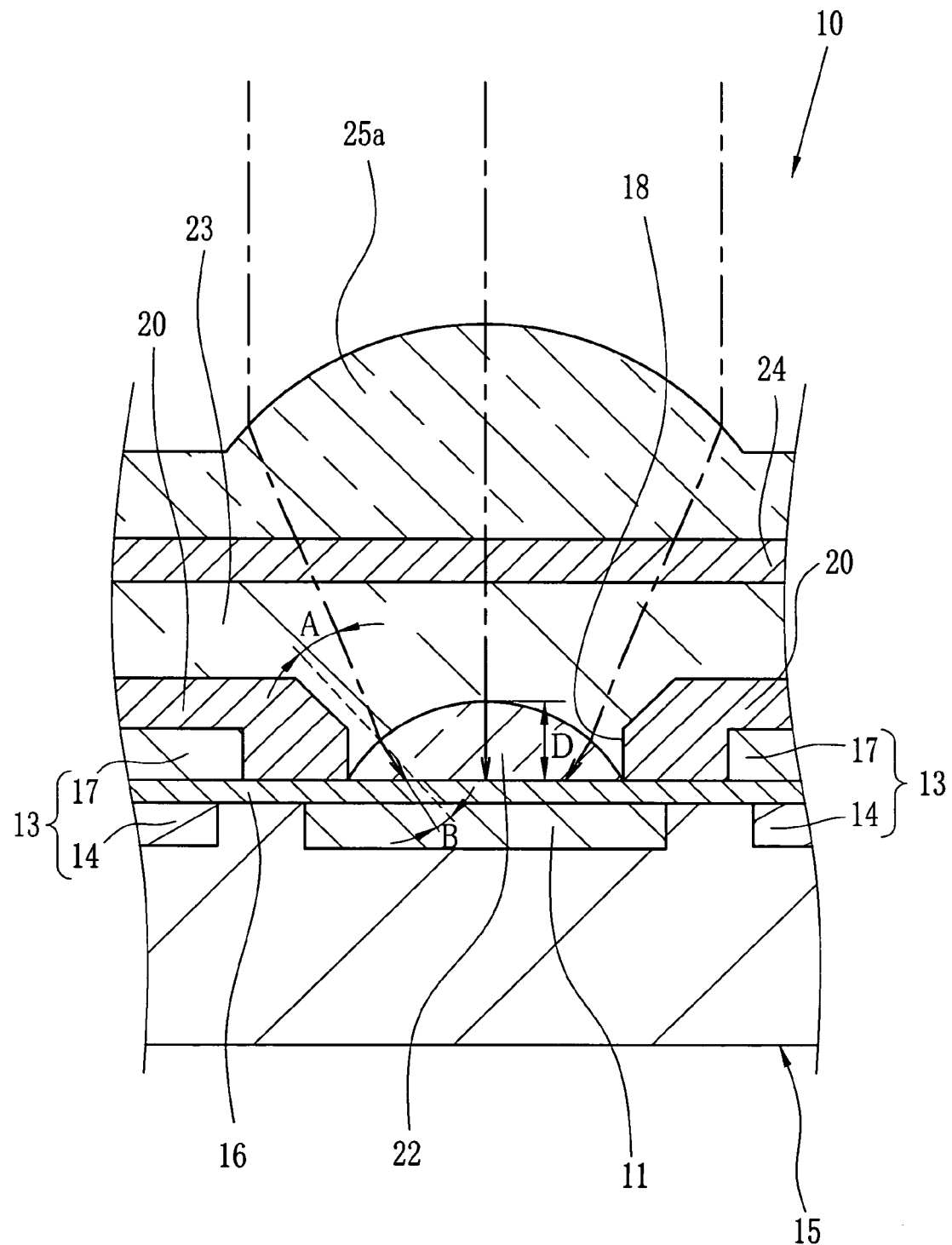
FIG. 3 is an enlarged cross sectional view around a converging structure.

As shown in FIG. 3, the converging lens 22 is a plano-convex lens defined by a flat bottom surface that faces the photodiode 11 and a top surface that curves outwards. The converging lens 22 is made of, for example, SiN (Silicon Nitride) whose refractive index $n_2$ (1.9 to 2.0) is larger than a refractive index $n_1$ (1.4 to 1.5) of BPSG comprising the planarizing layer 23 that surrounds the converging lens 22. Through the law of refraction (i.e., Snell's law), these refractive indices $n_1$ and $n_2$ satisfy following equation 1, where A is an incident angle of light entering the converging lens 22 from the planarizing layer 23 and B is a refraction angle of the light at the converging lens 22.

$$n_1 \cdot \sin A = n_2 \cdot \sin B (n_1 < n_2) \qquad \text{Equation 1}$$

Namely, the incident angle A is greater than the refraction angle B, and the light in the converging lens 22 is thus focused on the photodiode 11. It is to be noted that the material for the converging lens 22 is not limited to SiN, but anything with a higher refractive index than a surrounding medium.

The converging lens 22 is formed to satisfy a following equation 2, where D is a thickness of a thickest portion, i.e., a centre portion of the converging lens 22, λ is a wavelength of intended light, and N is an integer.

$$(\lambda/n_2)\{1/4 + N/2\} = D \qquad \text{Equation 2}$$

Owing to this, optical path difference between two light rays, one reflecting off the bottom of the converging lens 22 and the other reflecting off the top surface of the converging lens 22 (which difference is expressed as $2(n_2D)$), becomes equal to a value of the half-wavelength plus the wavelength multiplied by the integer (½λ+Nλ). Accordingly, these two light rays with amplitude of the wavelength λ cancel each other out. It is therefore possible to prevent the reflection of light at the boundary of the converging lens 22 and the planarizing layer 23, and the efficiency for focusing light on the photodiodes 11 is improved. Here, the wavelength λ is the wavelength of the light to be most prevented from reflection. For example, the wavelength λ may be a wavelength of the light corresponding to the three colors (R, G, and B) or four colors (R, G, B, and neutral color) of the color filter 24. Alternatively, regardless of the color filter 24, the wavelength λ may be a central wavelength in the visible light spectrum or the wavelength of green light which is the middle among R, G, and B light.

Next, an optical function of the CCD 10 is explained. The converging lens 22 has the refractive index $n_2$ larger than the refractive index $n_1$, of the planarizing layer 23 around the converging lens 22. The light that passed through the microlens 25 and the color filter 24 and then entered the planarizing layer 23 is focused on the photodiode 11 effectively by the converging lens 22. If the refractive index $n_2$ of the converging lens 22 were smaller than the refractive index $n_1$, of the planarizing layer 23 ($n_1 > n_2$), the refraction angle B of the light ray at the converging lens 22 would become larger than the incident angle A of the light ray entering the converging lens 22. Such a condition would deteriorate the focusing efficiency and allow light rays to permeate the transfer electrodes 17, resulting in the smear noise. But that never happens in the present invention.

Figure 4:
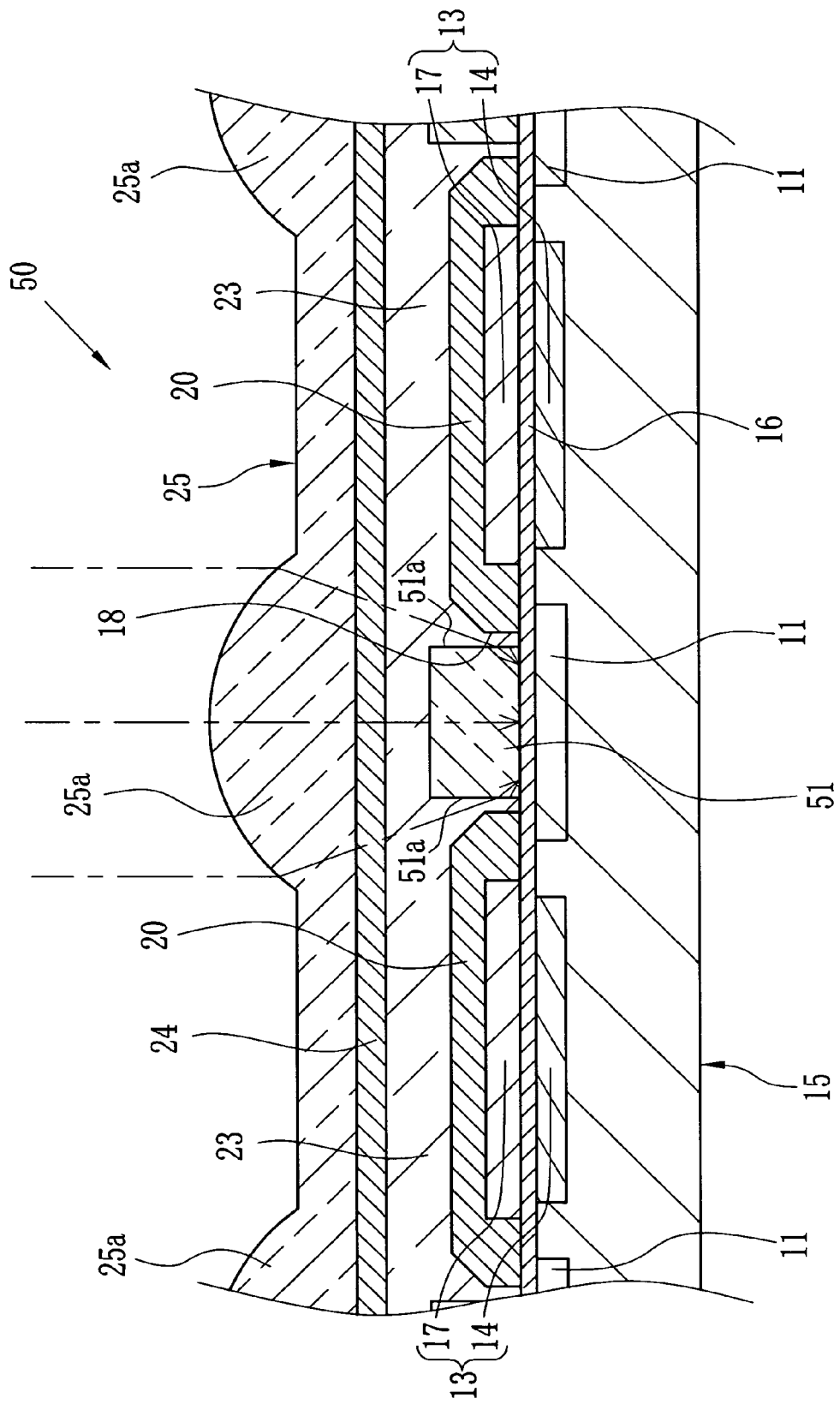
FIG. 4 is a cross sectional view of a solid state imaging device according to a second embodiment of the present invention, where a rectangular solid block is employed as the converging structure.
Figure 5:
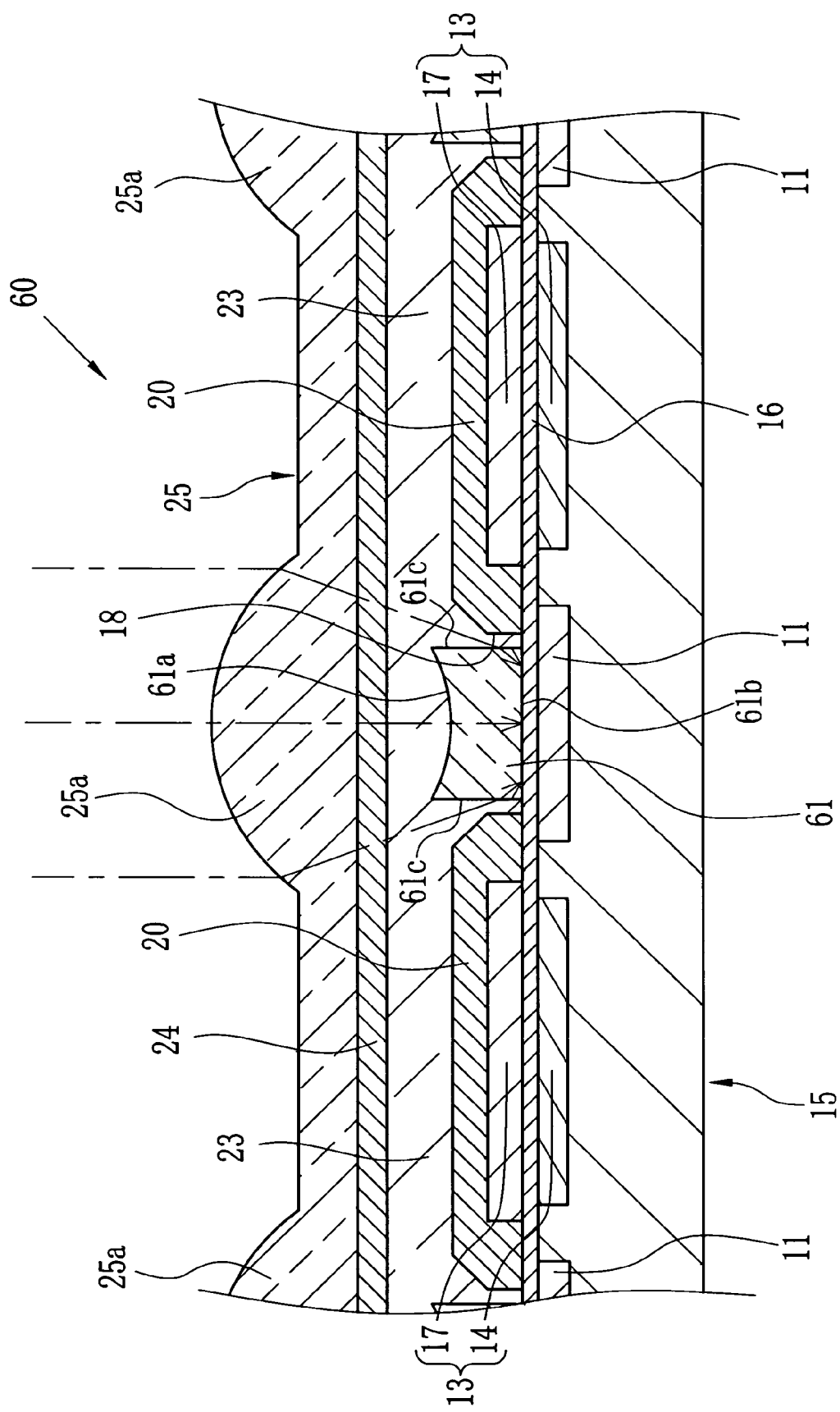
FIG. 5 is a cross sectional view of a solid state imaging device according to a third embodiment of the present invention, where a plano-concave lens is employed as the converging structure.

Although the above embodiment uses the plano-concave lens, the solid state imaging device of the present invention may employ the converging structure shown in FIG. 4 or FIG. 5. In these drawings, the components identical to those in the above embodiment are denoted by the same reference numerals, and the detailed explanations thereof are omitted.

As shown in FIG. 4, a CCD 50 has a rectangular solid block as a converging structure 51 in each opening 18. The converging structure 51, likewise the converging lens 22, is made of material with higher refractive index (e.g., SiN) than the surrounding planarizing layer 23. Accordingly, the incident light coming from the planarizing layer 23 will be focused on the photodiode 11 as in the case of previous embodiment. Additionally, each converging structure 51 has a smaller circumference than the opening 18, creating a gap to be filled by the planarizing layer 23 inside the opening 18. This configuration permits light to enter at side faces 51a of the converging structure 51. It should be noted that the converging structure 51 has a thickness to satisfy Equation 2, likewise the converging lens 22. Accordingly, the light rays at the wavelength λ in Equation 2 hardly reflect at the boundary of the converging structure 51 and the planarizing layer 23.

In FIG. 5, a CCD 60 has a plano-concave converging structure 61 with a concave top surface 61a and a flat bottom surface 61b in each opening 18. The converging structure 61 also has a higher refractive index than the surrounding planarizing layer 23, and focuses the incident light toward the photodiode 11. Additionally, each converging structure 61 has a smaller circumference than the opening 18, creating a gap between the opening 18. This configuration permits light to enter at side faces 61c of the converging structure 61. It should be noted that the converging structure 61 has a thickness to satisfy Equation 2. Accordingly, the light rays of wavelength λ hardly reflect at the boundary of the converging structure 61 and the planarizing layer 23.

Figure 6:
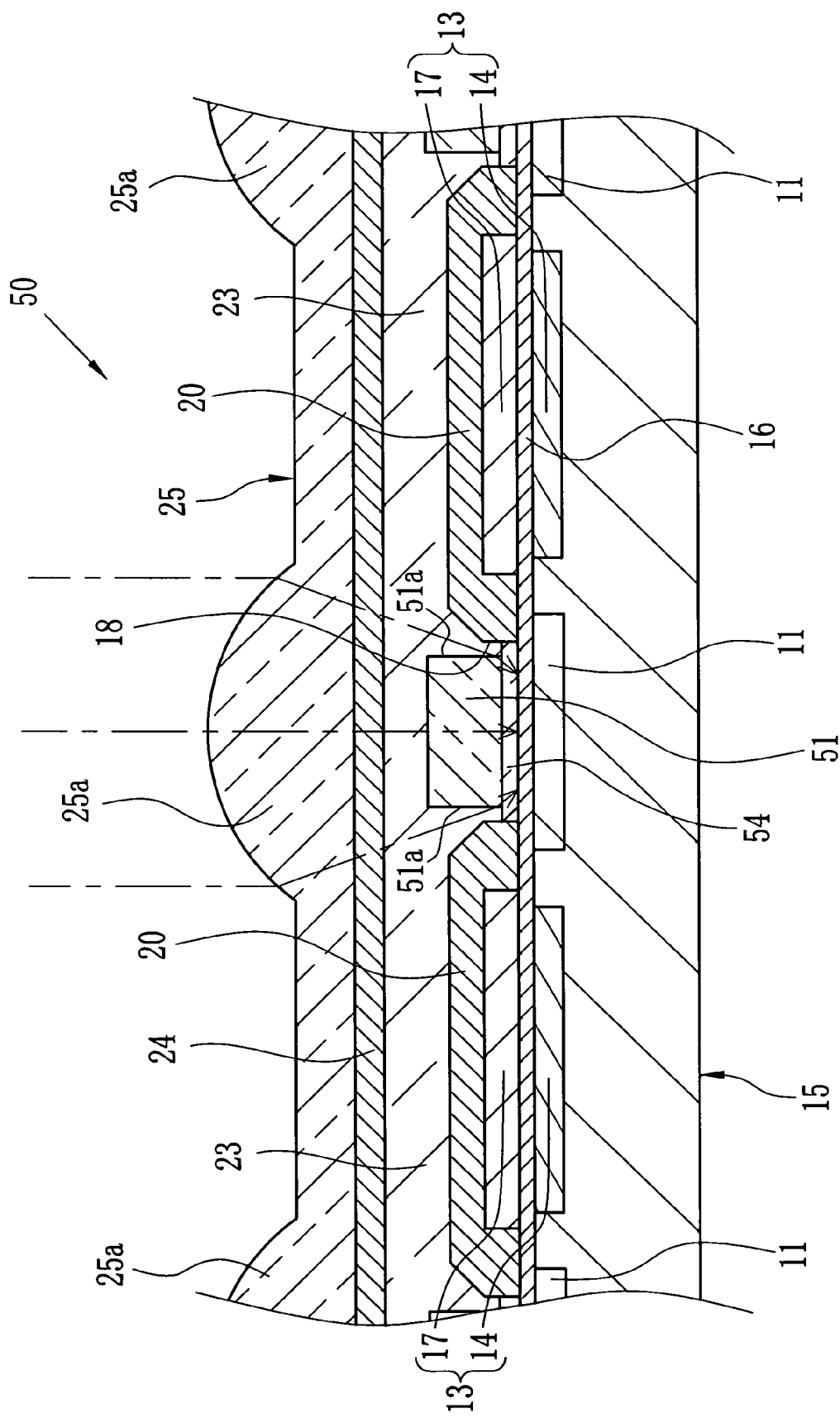
FIG. 6 is a cross sectional view of a variant of the second embodiment, where an anti-reflection film is formed between the converging structure and the photodiode.
Figure 7:
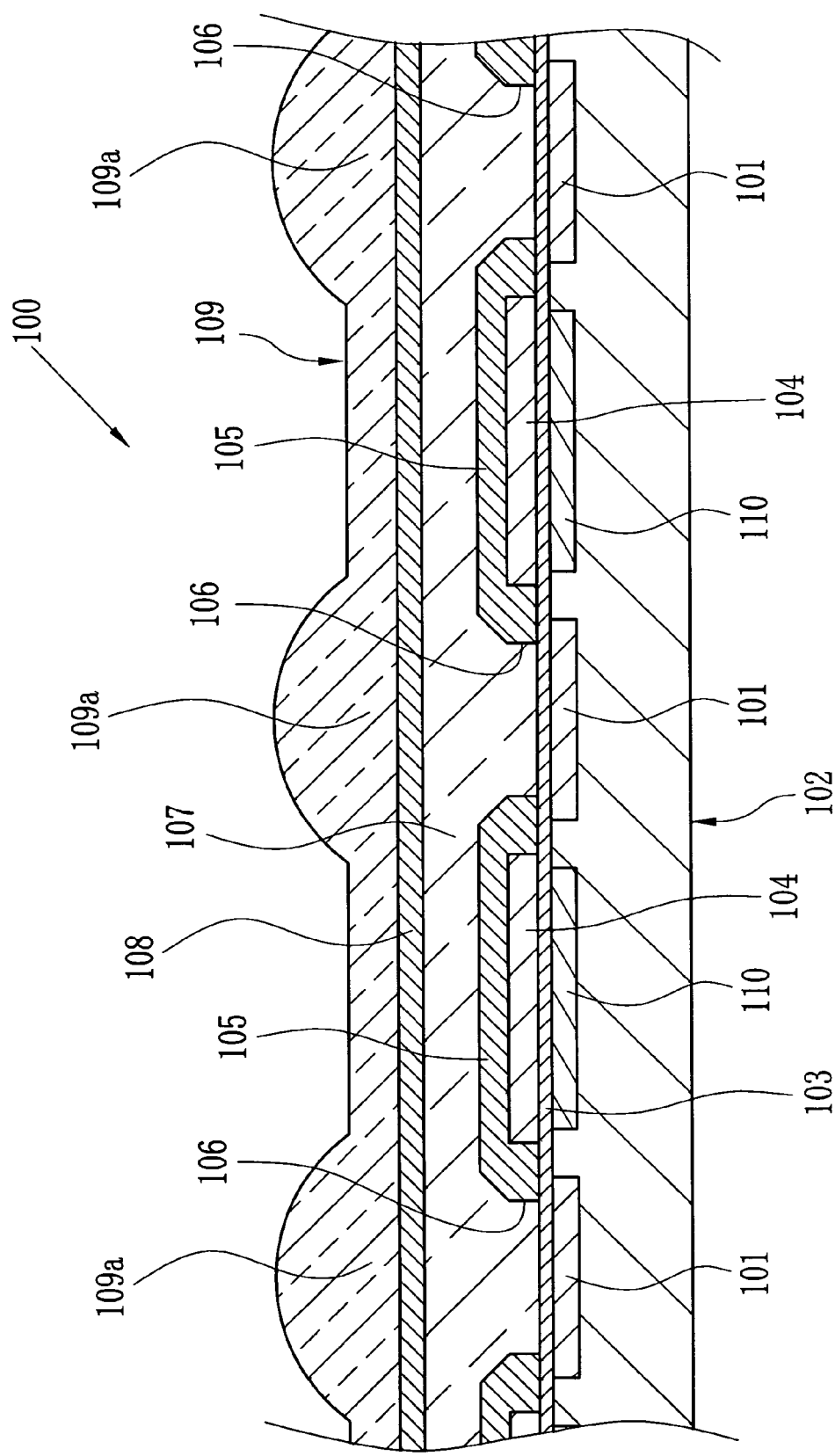
FIG. 7 is a cross sectional view of a conventional solid state imaging device.

Furthermore, the CCD 50 in FIG. 6 has an anti-reflection film 54 between each converging structure 51 and photodiode 11. The anti-reflection film 54 has a thickness to satisfy Equation 2 and thus prevents the reflection of light with wavelength λ. The light rays that reflected off the side faces 51a of the converging structure 51 will pass through the anti-reflection film 54 and move toward the photodiode 11. Accordingly, the incident light does not permeate the transfer electrodes 17, and the focusing efficiency is improved. The anti-reflection film 54 can be introduced between each converging structure 61 and photodiode 11 of the CCD 60 shown in FIG. 5, and the same effect will be achieved.

While the converging structure has an uniform refractive index in the above embodiments, the present invention is not limited to this. The refractive index of the converging structure may be greatest in the center portion and be gradually decreased toward the edge. This structure serves to focus the incident light more toward the center than the above embodiments.

Although the present invention has been fully described by the way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A solid state imaging device comprising:
   a semiconductor substrate on which light receiving elements and vertical transfer paths to transfer electric charges accumulated in said light receiving elements are formed;
   a light shielding layer covering said vertical transfer paths for protection from light and having openings formed at positions corresponding to said light receiving elements;
   a planarizing layer for covering said light shielding layer and said light receiving elements;
   microlenses disposed above said planarizing layer and for focusing light toward said light receiving elements; and
   a converging structure provided inside each of said openings, said converging structure having a higher refractive index than said planarizing layer,
   wherein said converging structure is made to satisfy an equation expressed as follows:

$$D=(\lambda/n_2)\{1/4+N/2\}$$

wherein D is a thickness of a portion located in a central region of said converging structure, λ is a wavelength of light entering said converging structure, and N is an integer.

2. The solid state imaging device of claim 1, wherein said converging structure is a plano-concave lens defined by a flat bottom surface and a convex top surface.

3. The solid state imaging device of claim 1, wherein said refractive index of said converging structure is gradually decreasing from the center toward the edge.

4. The solid state imaging device of claim 1, wherein said converging structure is a rectangular solid block.

5. the solid state imaging device of claim 4, wherein said converging structure has a smaller circumference than said opening.

6. The solid state imaging device of claim 5, further comprising an anti-reflection film provided between each of said converging structures and said photodiodes.

7. The solid state imaging device of claim 6, wherein said anti-reflection film is made to satisfy an equation expressed as follows:

$$D=(\lambda/n_2)\{1/4+N/2\}$$

wherein D is a thickness of a portion located in a central region of said anti-reflection reflection film, λ is a wavelength of light entering said anti-reflection film, and N is an integer.

8. The solid state imaging device of claim 1, wherein said converging structure is a plano-concave lens having a flat bottom surface and a concave top surface.

9. The solid state imaging device of claim 8, wherein said converging structure has a smaller circumference than said opening.

* * * * *